United States Patent
Cappelletti (10) Patent No.: US 6,222,775 B1
(45) Date of Patent: Apr. 24, 2001

(54) FLASH COMPATIBLE EEPROM

(75) Inventor: Paolo Cappelletti, Seveso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/599,356

(22) Filed: Jun. 21, 2000

(30) Foreign Application Priority Data

Jun. 22, 1999 (EP) .................................................. 99830390

(51) Int. Cl.⁷ .................................................. G11C 16/00
(52) U.S. Cl. ............................... 365/185.29; 365/185.18; 365/185.27
(58) Field of Search .................. 365/185.11, 185.18, 365/185.23, 185.13, 185.27, 185.28, 185.29, 185.22

(56) References Cited

U.S. PATENT DOCUMENTS

| | | | |
|---|---|---|---|
| 5,313,429 | * 5/1994 | Chevallier et al. | 365/185.22 |
| 5,365,484 | * 11/1994 | Cleveland et al. | 365/185.29 |
| 5,378,909 | * 1/1995 | Chang et al. | 365/185.29 |
| 5,491,656 | * 2/1996 | Sawada | 365/185.27 |
| 5,491,657 | 2/1996 | Haddad et al. | 365/185.27 |
| 5,657,271 | 8/1997 | Mori | 365/185.27 |
| 5,781,477 | * 7/1998 | Rinerson et al. | 365/185.18 |
| 5,796,657 | 8/1998 | Lee et al. | 365/185.11 |
| 5,822,252 | 10/1998 | Lee et al. | 365/185.3 |
| 5,966,331 | * 10/1999 | Shiau et al. | 365/185.29 |
| 6,000,004 | * 12/1999 | Fukumoto | 365/185.29 |
| 6,052,305 | * 4/2000 | Yang et al. | 365/185.27 |
| 6,072,722 | * 6/2000 | Hirano | 365/185.27 |
| 6,115,292 | * 9/2000 | Fukuda et al. | 365/185.29 |
| 6,147,909 | * 11/2000 | Fujio | 365/185.29 |

FOREIGN PATENT DOCUMENTS

| | | | |
|---|---|---|---|
| 97/48101 | 12/1997 | (WO) | G11C/16/06 |
| 98/10424 | 3/1998 | (WO) | G11C/11/34 |

* cited by examiner

Primary Examiner—Tan T. Nguyen
(74) Attorney, Agent, or Firm—Theodore E. Galanthay; Allen, Dyer, Doppelt, Milbrath & Gilchrist, P.A.

(57) ABSTRACT

A flash compatible EEPROM device has a first flash matrix and a second matrix with EEPROM functionalities of substantially similar layout. Both are divided into blocks of cells formed in substrate regions isolated from one another. In the second matrix, the information is organized in pages each contained in a row of memory cells of one of the blocks of subdivision of the matrix. A hierarchic structure including a row decoder addresses the wordline of all the cells of a selected row of the block, co-operating with a column decoder in selecting single cells of the rows. A boosted voltage of a polarity opposite to the supply voltage of the device is applied during an erasing phase to a single wordline selected by the row decoder, to page-erase the information by applying a boosted voltage to the common source of all the cells of the block and to the isolated region of the substrate containing all the cells of the block. A logic circuit confirms the programmed state of each cell containing a logic zero information of the not-erased rows of the block after one or more rows or pages have been erased, applying the first boosted voltage to a wordline at a time and the supply voltage to one or more bitlines at a time for confirming a preexistent programmed state, while keeping to ground voltage the common source of all the cells of the block and the confined isolated region of the substrate.

29 Claims, 4 Drawing Sheets

FIG. 2A.
(PRIOR ART)
WRITE

FIG. 2C.
(PRIOR ART)
WRITE

FIG. 2B.
(PRIOR ART)
ERASE

FIG. 2D.
(PRIOR ART)
ERASE

FLASH COMPATIBLE EEPROM

FIELD OF THE INVENTION

The present invention relates to the field of semiconductor memories, and, more particularly, to FLASH-EPROMs (Erasable Progammable Read Only Memory) and EEPROMs (Electrically Erasable Progammable Read Only Memory) on the same chip.

BACKGROUND OF THE INVENTION

The development of nonvolatile memories based on the principle of trapping electrical charge in an isolated gate (floating) of a field effect transistor (cell) to modify its turn-on threshold, has had and continues to have an extremely important role in the achievement of ever increasing levels of compactness, speed and low consumption of integrated systems. The development of such memories is strictly tied to a parallel development of suitable fabrication technologies and to the physical mechanisms that can be practically exploited for injecting electrical charge into a floating gate through the isolating dielectric, which often forms the gate dielectric of the complete structure (transistor) of the cell.

Relevant mechanisms will now be described. The so called Fowler-Nordheim (FN) tunnelling mechanism is operative with relatively thin oxide layers and requires a strong electric field. The direct tunnelling mechanism (DT) is operative with relatively thin oxide layers and with a relatively low electric field, is important for the charge retention, and establishes the lower level of the gate oxide scaling in nonvolatile memories. The tunnelling mechanism (IN) is assisted by charge traps in the dielectric created from electrical stresses and which represent the principal mechanism of charge loss in flash cells and in EEPROM cells that have been subjected to numerous programming and erasing cycles. The hot channel carrier injection mechanism is operative throughout an ample range of dielectric thickness and electric field intensities. Of course the above mechanisms, with the exception of the last, may theoretically be exploited also for extracting charge from the floating gate, i.e. for erasing the cell, though the voltage levels must be compatible with the physical-electrical structure of the cell.

It is evident that the charge and discharge mechanism of the floating gate will dictate the structure of the memory cell and of the overhead circuitry, with particular regard to writing, reading and eventually also the erasing circuits of the memory. This imposes case-by-case precise requirements of voltage and current levels necessary for programming and eventually erasing data stored in the memory, besides those required for reading them.

The need of altering the content of the memory by single "words" (herein intended to indicate a unit of information composed of a certain number of bits, for example 8, 16, 32 etc.) without having to reprogram the entire memory as in the case of the so-called EPROM memories, and therefore the requirement of erasing certain selected cells while leaving unchanged the information content of other memory cells, has led to develop the so called EEPROM or $E^2$PROM cells, acronyms for Electrically Erasable and Programmable Read Only Memory. Typically, the problem tied to the necessity of biasing the floating gate through its capacitive coupling with a control gate and the semiconducting substrate to charge the floating gate and eventually discharge the electrical charge stored therein, has been satisfied by realizing a capacitive coupling zone between the floating gate and the drain region of the substrate through a thin tunnelling oxide. Through such a tunnelling window the flow of electrons from the isolated gate to the drain region, both during an erasing and a programming phase, occurs by the so-called Fowler-Nordheim tunnelling mechanism, by applying a sufficiently high voltage of one sign or of the opposite sign.

As it is well known, bytewise erasability of EEPROM memories is achieved with a penalty in terms of compactness of the memory cell matrix, these cells being from three to four times larger than an EPROM cell, for the same fabrication technology, because they require the integration of a select transistor associated with each cell. The fabrication process of an EEPROM memory of known kind is notably much more complex than an EPROM process and the EEPROM memory requires relatively more complex overhead circuitry, as well as the integration of voltage multipliers.

The improvement of fabrication technologies has allowed a further reduction of the minimum thickness of the insulating oxide between an insulated gate and the monocrystalline silicon substrate while reliably ensuring a remarkable absence of defects, down to an average thickness of the oxide much smaller than 100 Å. The FLASH cell is programmable through a mechanism of injection of hot channel electrons into the isolated gate, by biasing the gate electrode (control gate) with a sufficiently high positive voltage (for example in the order of 12 V) and the drain with a voltage of about 6V, to produce in the channel region of the cell a strong electric field suitable to generate within the silicon a current of highly energetic (hot) electrons capable of overcoming the potential barrier at the interface with dielectric to be thereafter attracted towards the floating gate by the electric field.

Because of the extreme thinness of the gate dielectric, by applying a relatively high voltage (up to 12V depending on the fabrication technology) to the source while maintaining the other electrodes to ground potential, the electrons injected into the floating gate are able to cross the thin dielectric according to a Fowler-Nordheim tunnelling mechanism and "discharge" in the source region, during an erasing phase of the memory. The possibility of electrically erasing the memory device without removing it from the printed circuit card for exposing it to UV light has solved a most severe problem of EPROM memories. With the overcoming of this problem, all the intrinsic advantages of EPROM memories, such as the extreme compactness, speed and above all their low cost, have opened an extremely vast field of application.

On the other hand, given that normally the flash memories are block-erasable, there is the possibility during the erasing phase some cells, faster than others, that they be over-erased (depleted) and assume a negative threshold voltage. Since the memory cell has no select transistor, the presence of depleted cells causes reading errors. In fact the reading phase takes place by applying a positive voltage to the selected wordline, being all other wordlines grounded and verifying the current absorbed by the selected bitline. A depleted cell provides current even with its wordline grounded making all other cells of the same bit line be read as "1" even if they are programmed as "0". For this reason, the erasing process of FLASH memories is intrinsically critical and is commonly carried out through a succession of erasing bias pulses followed by verification until completing the erasing of all the cells of the memory. This is done while avoiding inadvertently bringing some of the cells to a depletion state.

Upon completing the erasing phase, unlike the EEPROM cells, which being provided with a select transistor the read current of erased cells is not determined as much by the threshold voltage of the cells but by the current that can be provided by the select transistor, individual FLASH-EPROM cells assume a threshold voltage value that is non-uniform and constant, but is within a certain range of variation. In other words, there is a spread of the threshold values of the cells, the breath of which is tied also to parameters of the fabrication process. Such a spread of the threshold values of the cells must be taken into account by the overhead circuitry of the memory.

To obviate this drawback of FLASH-EPROM memories, a particular cell structure has been proposed, wherein each control gate line (wordline) of the memory overlies (it is capacitively coupled) only for a portion of its width on the relative floating gates of the cells of the row, while the other portion forms the gate of as many select transistors, each associated to the structure of a respective cell of the row. In this way, though with a penalty in terms of compactness, a select transistor is associated to each cell, thus making substantially uniform the threshold value of all the cells once the erasing of the memory array is performed. This technique is described in the paper entitled "A 128K Flash-EEPROM using Double Polysilicon Technology" by George Samachisa, Chien-Sheng Su, Yu-Sheng Kao, George Smarandoiu, Ting Wong, Chenming Hu, presented at the IEEE International Solid State Circuits Conference of Feb. 25, 1987.

Notwithstanding the relatively low cost, speed and compactness of FLASH-EPROM memories, there are some particular applications of such memories which also need to associate to a FLASH-EPROM memory an EEPROM memory block (typically of much lower capacity) for storing data to be frequently altered (updated). These requirements generally occur in systems wherein only a small portion of the data stored in a permanent manner is to be frequently updated, while a vast mass of data is destined to remain unvaried in time or to be modified only at relatively long intervals or only in consequence of exceptional events. Situations of this kind are common in the field of automatic control, regulation, self-diagnostic systems that are increasingly employed in the car industry and in similar industries, wherein periodically it is necessary to modify/update data relative to tests, maintenance, modification of the values of certain operation parameters and so forth.

Block-erasable FLASH-EPROM memories have been proposed to meet these market demands. According to one of these techniques, the possibility of block-erasing the memory is obtained by segmenting the source lines (diffusions), realizing a further order of metallization lines to which the different portions or segments of source lines are connected through interconnection ways, and an additional decoder to select the memory blocks to be erased. Such a technique is described in the patent U.S. Pat. No. 5,289,423.

These systems are intrinsically too rigid to meet the different requirements of users in an optimum way, and imply a remarkable complication of the layout of the memory because of the increased number of metallization levels and the realization of a large number of "cross overs" at cross points between lines of the same level. In the majority of cases, the user requirements could be satisfied in an optimum way by realizing an EEPROM memory block of suitable size, in the same chip containing a FLASH-EPROM memory, typically of much larger capacity, thus avoiding the need of employing two distinct memory devices.

It is well known the difficulty of compatibly integrating in the same device a FLASH-EPROM memory and an EEPROM memory because of their structural differences as well as the different requirements in terms of voltage levels and current capabilities of the overhead circuitry. Problems of compatibility are even more marked in the case of single supply fabrication processes and therefore requiring charge pump circuits and voltage multipliers integrated on the memory device for generating the relatively high voltages needed during programming and erasing phases. Even assuming that compatibility problems can be overcome by complicating the fabrication process as needed (by recourse to numerous additional masking steps) and by duplicating or multiplying the circuitry where needed for generating the different voltages needed during write, read and erase phases of the two different memories, the yield of such a complex process, and therefore the cost of the devices, would be discouraging.

Even solutions offering a pseudo-EEPROM performance (device functionality), though substantially realizing a FLASH-EPROM memory, by exploiting software methods based on momentarily shifting the data on a different support, correcting or updating and rewriting them in the previously erased FLASH-EPROM memory, are burdensome in terms of the considerable time that is requested to the system microprocessor.

In the document EP-A-0704851 in the name of the present assignee, an EEPROM memory compatible FLASH-EPROM is described. According to the invention disclosed in the above document, a byte-wise erasable memory (EEPROM) is realized by employing a FLASH-EPROM cell matrix, organized in rows and columns individually selectable (during a programming and reading phase) through a plurality of wordlines and bit lines, according to a normal memory architecture. The mechanisms of programming (writing) and erasing the cells remain those of a normal FLASH-EPROM cell, i.e. the hot electrons injection mechanism from the channel region to the floating gate of the cell which takes place in a zone close to the drain diffusion, in the programming phase, and the Fowler-Nordheim tunnelling mechanism, which takes place in an overlap zone of the floating gate on the source region, in the erasing phase.

Byte-wise erasability of the memory is provided by realizing an auxiliary byte select structure that comprises a byte selection transistor, to a current terminal of which are connected in common the sources of the cells of a row of the matrix that compose a certain byte, and having the other current terminal connected to a respective line of a plurality of source biasing lines individually selectable by the overhead circuitry. All the byte select transistors arranged along the same row of the matrix have their gate driven in common through a respective line of a plurality of select lines in the same number of the wordlines of the memory matrix. Byte erasing takes place by biasing through the byte select transistor connected in series to the sources of the memory cells of the selected byte to be erased, the sources of the cells and the relative wordlines (control gate of all the cells of the row) with a voltage suitable to generate a FN tunnelling current of electrons from the floating gates of the cells to their respective source regions, while splitting the voltage. In practice, a negative voltage is applied to the wordline and has a value insufficient to cause soft-erasing phenomena on the other unselected memory cells of the same wordline, while "complementary" positive voltage is applied to the sources, through the select transistor, i.e. a voltage that is proportionately reduced if compared to the absolute value of the negative tunnelling voltage to be applied to the control gate (multiplied by the capacitive ratio of the floating gate cell structure). During an erasing phase the drain of the cells may be grounded or left floating.

Continuous improvements in fabrication technologies, while enhancing the compactness of FLASH cells, impose a separation of the whole FLASH memory in individually erasable blocks, isolated from each other in separated tubs (so-called triple-well architecture), such that the erasing of a memory block does not cause a loss of data in adjacent blocks. The size of the subdivision blocks (matrix granularity) is established based on the most convenient compromise between: the increment of silicon area requisite due to the realization of the separation structures and the time necessary for erasing operations that must necessarily include a refresh operation of registered data. This evolution towards an ever more compact matrix architecture, but divided in electrically isolated blocks, realized in distinct tubs, allows the exploitation of a tunnelling (FN) mechanism from the floating gate to the channel region of the cells in place of a Fowler-Nordheim (FN) tunnelling mechanism on a suitable overlap zone of the floating gate on the cell source region to erase the FLASH memory cells, because of the possibility of positive biasing the tub hoisting the channel regions of all the cells of a certain FLASH memory block, being the tub electrically isolated from adjacent tubs.

Furthermore, channel erasing implies a relevant reduction of the absorbed current, with obvious advantages, and favors the scaling down of the gate length of the cells because it eliminates the need of a graded source junction. Such a change of the way of erasing by a Fowler-Nordheim tunnelling scheme instead of a source-gate kind according to a channel-gate scheme, makes the technical solution described in the previously cited European Patent application EP-A-0704851 if not inoperative, at least requiring important changes in the fabrication process and the use of additional masks. The changes are for optimizing the performances of two substantially different kinds of memory cells and thus to introduce a certain divergence from the respective fabrication processes.

It is natural that the technological advances of fabrication processes have re-proposed the objective of realizing an EEPROM memory function via hardware in a truly compatible way with a standard fabrication process of a FLASH-EPROM memory device.

SUMMARY OF THE INVENTION

It is an object of the present invention to provide an efficient way to implement a page-erasable EEPROM memory perfectly compatible with a standard fabrication process of new generation FLASH-EPROM memory devices.

A page-wise EEPROM function (erasing function), a page coinciding with the information content of a single row of a memory block realized in an isolated tub, is realizable via hardware without requiring the use of a temporary storage buffer. In applications requiring byte-wise erasability, it is necessary to use a buffer register (typically a SRAM register) but of a capacity limited to a single page. Substantially, the invention is based on using a different scheme of erasing the EEPROM memory block as compared to the scheme used for erasing the FLASH-EPROM memory blocks, which as far as the layout is concerned, are advantageously almost identical.

Though the erasing mechanism for the cells belonging to the two different kinds of memory blocks is identical, the respective overhead circuit is different for the two kinds of blocks. While all the cells of a FLASH-EPROM memory block are erased together, typically by applying a positive voltage to the substrate (isolated body region in common with every memory cells contained in a block), to the terminals of the common source and of the drains of the cells, and a negative voltage to all the wordlines, in the case of an EEPROM memory block, the negative voltage is applied to the single wordline of the cells to be erased. In this way the data registered in the cells of all the other rows of the EEPROM block are not lost.

If each row of the EEPROM block coincides with a page of organized data, it is possible to implement an EEPROM function of page-wise erasing without requiring a RAM register as a buffer. Alternatively, if the particular application requires a byte-wise erasability, a RAM buffer register, composed by a number of cells identical to the number of cells present on each row of the EEPROM block, is sufficient.

According to the method of the present invention, a byte-wise or page-wise updating operation is not limited to the erasing and rewriting of the selected row (page). In fact, the other rows of the EEPROM block though not losing the data stored therein during the erasing of one or several rows in sequence, undergo an electrical stress because of the biasing with a positive voltage of the common substrate. Such a stress, caused by erasing and rewriting cycles, could cause a data loss, in particular of "zeroes", i.e. a degradation of the "programmed" state of the cells with a logic zero information content. To counter any undue loss, after each byte-wise or page-wise erasing and reprogramming cycle in an EEPROM block, all zeroes of the block are reconfirmed, by reading and reprogramming every byte of all the pages (rows) that have not been subjected to erasing and eventual rewriting. The zeroes refresh operation dictates the maximum size the EEPROM block may have, in consideration of the longest erasing time acceptable in the specific application.

Since the erasing time allowed for an EEPROM block is normally about one order of magnitude lower than that commonly requested for a FLASH-EPROM block, erasing voltages even higher than those used in the FLASH-EPROM blocks can be optionally used in the EEPROM block. Moreover, cells with a more advantageous capacitive ratio may be used in the EEPROM block, in order to enhance the speed of the erasing process.

The result of the concomitance of the above indicated features of the memory architecture of the present invention is that the "granularity" i.e. the dimension of the "triple-well" isolated blocks into which both the FLASH memory portion and the EEPROM memory portion are divided, can be remarkably coarser up to a maximum limit established by the imposed limit of the time necessary to complete one erasing re-programming cycle (including the operation of refreshing the zeroes of the whole memory block). The possibility of employing a non-excessively fine granularity by exploiting the zeroes refresh operation, permits a much less critical layout and considerably reduces the costs though assuring an excellent reliability.

In particular, the double functionality is obtained in the same device, with a layout of the memory cells that advantageously remains substantially identical, from an electrical point of view, both for the blocks with FLASH-EPROM functionality and for the blocks with EEPROM functionality, except for a possible different size (storage capacity) of the two types of memory blocks. Implementation of an EEPROM functionality does not impose a "granularity" (dimension of isolated blocks of cells) by single page or by single byte, which would require a multiplication of isolation separation structures to an unacceptable level from the point of view of costs.

BRIEF DESCRIPTION OF THE PREFERRED EMBODIMENTS

A more detailed description of several embodiments of the invention hereinbelow will highlight in greater detail the aspects and advantages of the invention while referring to the following figures.

DETAILED DESCRIPTION OF THE PREFERRED EMBODIMENTS

Figure 1A:
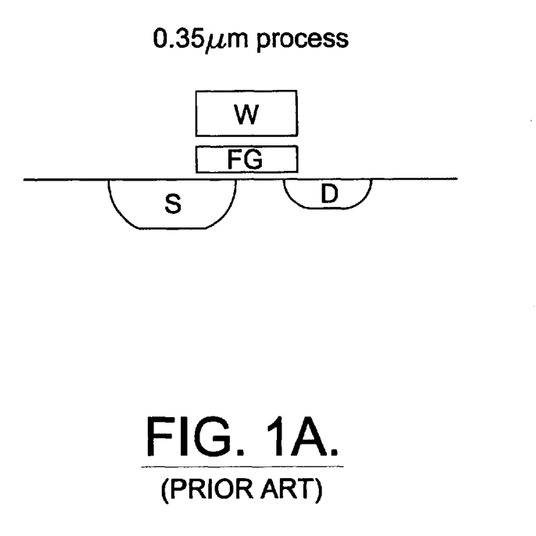
FIGS. 1A and 1B provide a comparison of the functional structure of a FLASH memory cell according to a currently used fabrication technology of 0.35 mm line width with the structure of a new generation FLASH cell with "triple-well" isolation realized with a process technology of 0.25 mm line width.
Figure 1B:
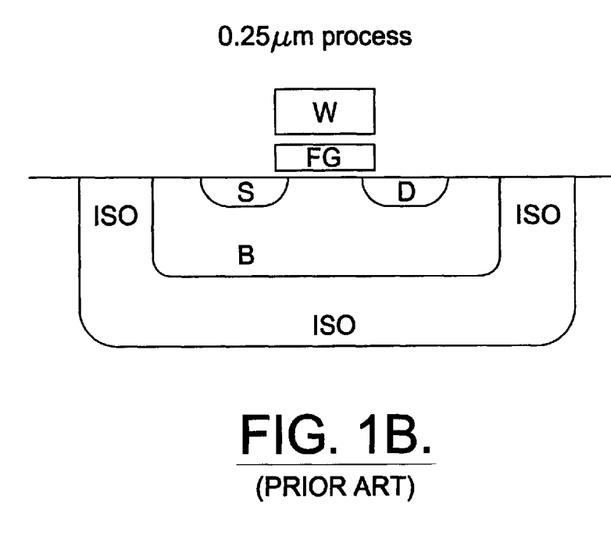
Figure 2A:
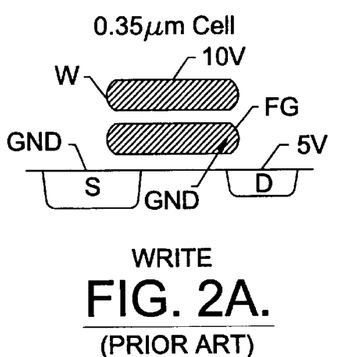
FIGS. 2A–2D illustrate writing and erasing schemes for the two types of FLASH cells of FIGS. 1A and 1B.
Figure 2B:
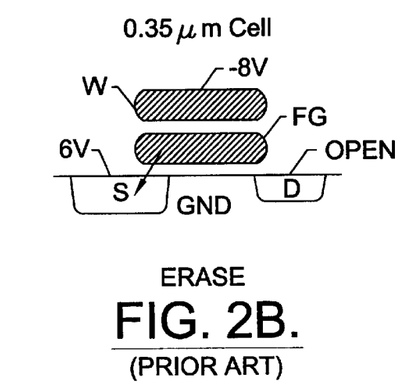
Figure 2C:
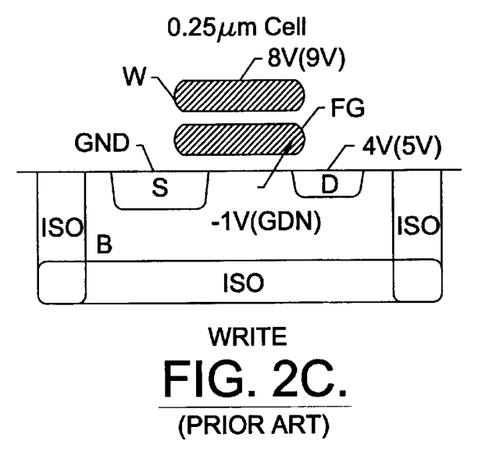
Figure 2D:
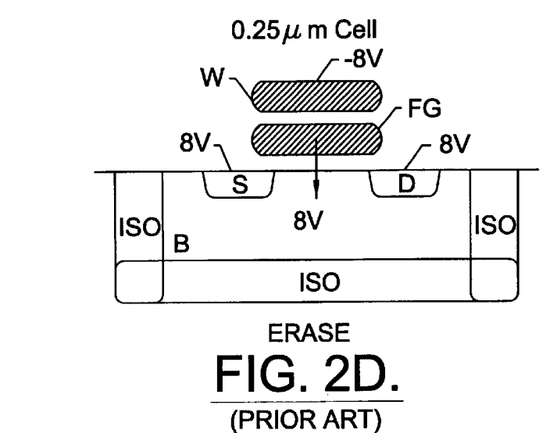

For comparison purposes in FIGS. 1A and 1B, respective structures of a floating gate FLASH memory cell according to a common fabrication process of commercially available devices in which the minimum definition width of the structural details of the integrated circuit is 0.35 $\mu$m and of a floating gate FLASH memory cell of future commercialization devices in which, through further technological refinements, the minimum definition width is reduced to 0.25 $\mu$m are schematized. In the structure of the next generation cells, also the depths of the source and drain diffusion, S and D, and the thicknesses of the gate dielectric and of the interpoly dielectric between the floating gate FG and the control gate W (wordline) are proportionally reduced.

The need for dividing FLASH memory arrays into a plurality of sectors or blocks increases the storage capacity of a single device. The division become more pressing, and is made more effective, by forming all the cells of a block inside a well region B (common body of the cells) that is electrically isolated from the other regions of the semiconductor substrate by forming a so-called double well structure, in which the B region is electrically isolated from the remaining substrate by isolating regions ISO of opposite type of conductivity of the region B, which is identical to that of the substrate. For illustrative purposes, the structure of a single cell is shown inside the isolated B region of the substrate, but in practice, inside each isolated region, a certain number of memory cells, organized in a canonical manner in an array or matrix of rows and columns of cells are formed, in order to make a memory block of a certain capacity of recordable data.

For comparison purposes, respective erasing and writing schemes are illustrated in FIGS. 2A–2D. Voltage values are purely indicative, reflecting compatibility with a certain 0.35 $\mu$m fabrication technology and with a certain 0.25 $\mu$m fabrication technology. As may be observed by comparing the schemes of FIGS. 2A–2D, while in present day devices of 0.35 $\mu$m line width, the substrate is maintained at ground potential GND both during the writing phase and the erasing phase, in case of new devices of 0.25 $\mu$m line width, the isolation of the memory block allows the biasing with a positive voltage of the body region B of the cells of the block. Such a positive voltage biasing of the body region during the erasing phase permits a favorable redistribution of the electrical stress to which the delicate interpoly dielectric layers that capacitively couple the wordline W to the floating gate FG and therefore to the channel region of the cell is subjected, though ensuring an adequate speed of the charge transfer process through the dielectrics.

The charge transfer mechanisms remains the same in both cases, i.e. the mechanism of charge injection in the floating gate FG in a writing phase remains via channel hot electrons (CHE), while in writing phase the mechanism of discharge of the floating gate FG is the Fowler-Nordheim (FN) tunnelling mechanism. Nevertheless, in the case of the algorithm for 0.25 $\mu$m technology structures, the electric charge transfer occurs from the floating gate FG through the cell channel region, while in the case of 0.35 $\mu$m technology structures, it occurs from the floating gate FG to the source region S and requires a double diffused source in order to expand laterally the diffusion profile sufficiently below the edge of the floating gate FG.

The algorithm describing the writing phase of a 0.25 $\mu$mm technology, can be further improved, by applying a negative voltage of about –1V, as indicated in FIG. 2, to the region B instead of maintaining it at the ground potential thus dividing in a slightly modified way the voltages applied to the control gate (wordline) W and the relative bitline (drain). In fact it has been found that by applying a relatively small negative voltage to the common substrate region of all the cells of the block, and decreasing by an equivalent quantity the voltage applied to the bitline (drain) and the voltage applied to the wordline (control gate), the mechanism of charge injection in the floating gate FG is faster, thus reducing programming times. In the respective scheme of FIGS. 2A–2D, two alternative schemes of application of the writing voltages to a cell are indicated (one of which in brackets).

According to the fundamental aspect of the present invention, the single memory device contains a first matrix of floating gate memory cells with FLASH-EPROM functionality, conventionally realized in a certain number of blocks of subdivision of the matrix, each block being organized in a certain number of bytes, of a certain number of bits, addressed through a plurality of wordlines and bitlines selected by respective hierarchic address decoding structures of conventional architecture. The device contains a second matrix of floating gate memory cells with EEPROM functionality, realized in a certain number of matrix subdivision blocks, each block organized in a certain number of bytes, of a certain number of bits, addressed through a plurality of wordlines and bitlines selected by hierarchic address decoding structures of a conventional type.

Figure 3:
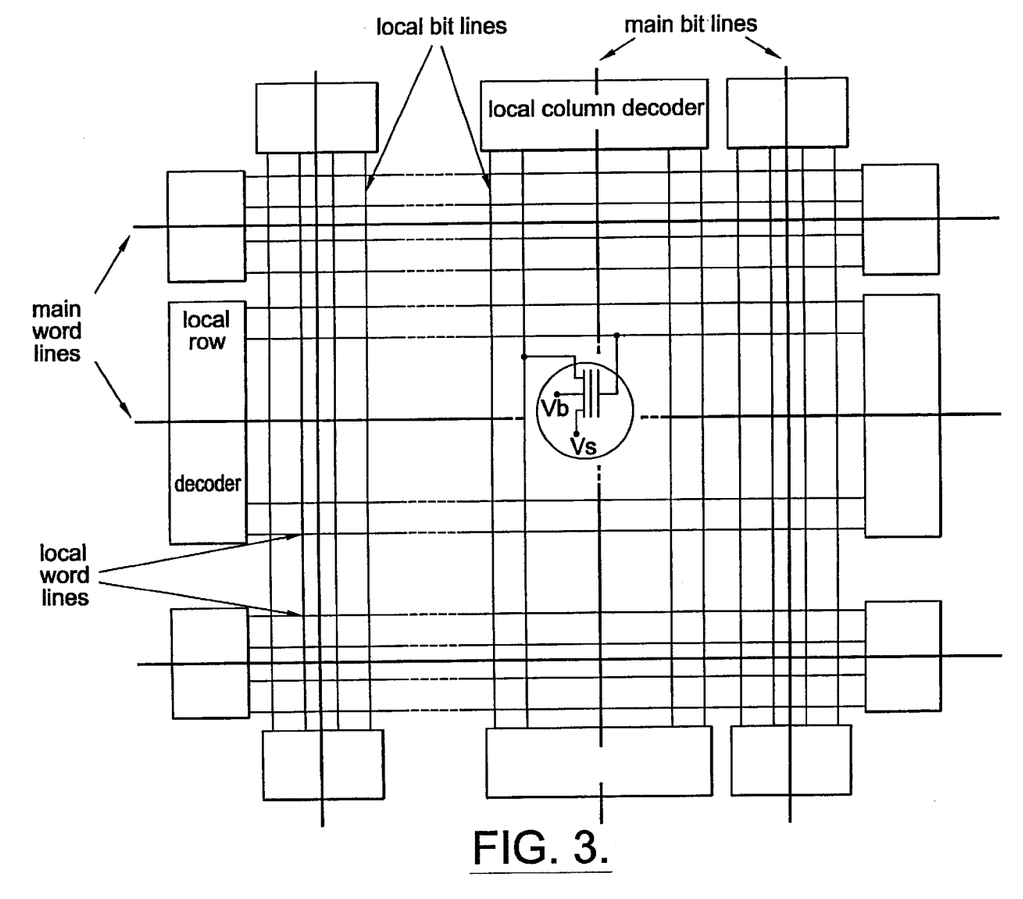
FIG. 3 shows the architecture of a memory matrix of the present invention, using a hierarchic decoding structure, both for the FLASH memory portion and for the EEPROM block.

At least from an electrical point of view, the cells and their organization in rows and columns of each isolated block are substantially identical and therefore perfectly compatible in terms of fabrication process. Even the layout is substantially similar for the two types of blocks of memory cells, with FLASH-EPROM functionality and with EEPROM functionality, respectively, and the auxiliary address circuitry is substantially similar. Preferably, these circuits are of the so-called hierarchical type effecting a cascade decoding, from main wordlines to local row decoders and similarly from the main bitline decoding to local column decoders, according to a scheme depicted in a general fashion in FIG. 3.

A detailed description of the hierarchic decoding circuitry to address the single cells is not necessary for a complete illustration of the essential aspects of the present invention and there is abundant literature on the subject of implementing an efficient circuit for addressing the cells of a memory matrix, as it is well known to the skilled person. Any address architecture may be satisfactorily used in a device of the present invention provided that it satisfies the requisites of the erasing, writing and reading algorithms of the registered data, in the memory blocks with FLASH-EPROM functionality and in the memory blocks with EEPROM functionality.

According to a preferred embodiment of the invention an EEPROM functionality is obtained entirely via hardware, by organizing the information in the memory matrix with EEPROM functionality into pages, the information content of each page being contained in a single row of memory cells of one block. The relative hierarchical decoding structure includes a row decoder able to select, during the erasing phase, a single wordline of the block corresponding to a page of information to erase, leaving unchanged the information contained in any other page (row) of the block. The two following tables report writing and erasing schemes of a FLASH-EPROM memory block and of an EEPROM memory block. The voltage values, according to a first option and to an alternative option (voltages indicated in parenthesis), are purely indicative, corresponding to actually preferred values according to the present day fabrication technology. Naturally, depending on the choice of voltage values, appropriate charge pump circuits will be employed, dedicated to the generation of the different voltages, from an externally apply supply voltage.

| Operation | Node | Selected byte | Other bytes on selected wordline | Other bytes on selected bitline | Any other byte |
|---|---|---|---|---|---|
| FLASH-EPROM | | | | | |
| Program | Control gate (Vcg) | 8V (9V) | 8V (9V) | GND | GND |
| | Source (Vs) | GND | GND | GND | GND |
| | Drain (Vd) | 4V (5V) | OPEN | 4V (5V) | OPEN |
| | P-well (Vb) | −1V (GDN) | −1V (GDN) | −1V (GDN) | −1V (GDN) |
| Erase | Control gate (Vcg) | −8V | −8V | −8V | −8V |
| | Source (Vs) | 8V | 8V | 8V | 8V |
| | Drain (Vd) | 8V | 8V | 8V | 8V |
| | P-well (Vb) | 8V | 8V | 8V | 8V |
| EEPROM | | | | | |
| Program | Control gate (Vcg) | 8V (9V) | 8V (9V) | GND | GND |
| | Source (Vs) | GND | GND | GND | GND |
| | Drain (Vd) | 4V (5V) | OPEN | 4V (5V) | OPEN |
| | P-well (Vb) | −1V (GND) | −1V (GND) | −1V (GND) | −1V (GND) |
| Erase | Control gate (Vcg) | −8V | −8V | GND | GND |
| | Source (Vs) | 8V | 8V | 8V | 8V |
| | Drain (Vd) | 8V | 8V | 8V | 8V |
| | P-well (Vb) | 8V | 8V | 8V | 8V |

By comparing the biasing conditions for the two types of memory blocks, it is noted that the schemes are substantially identical, except for the erasing algorithm of the memory block with EEPROM functionality in which the rows are individually selected by respective row decoders to apply the negative voltage to the wordline (control gate) of the single row corresponding to the page of data to be erased, leaving unvaried the information written in the other pages of the EEPROM block. Selection of the rows to erase is done by a local row decoder circuit. For example, the decoder circuit may have the structure described in the patent application EP 97830625.6, of Nov. 26, 1997, in the name of the present assigneee, entitled "Row decoder for a FLASH-EEPROM memory device with possibility of selective erasing of a row subgroup of a block". Of course, even according to the present invention more rows or pages of information can be selected for simultaneous erasure.

According to an important aspect of the method of the invention, the erasing operation of one or more rows of a certain block of subdivision of the EEPROM matrix, is completed by a confirmation or refresh operation of the "programmed" state of all the memory cells of the block, that is containing a logic zero, eliminating any possible degradation of the programmed condition of the not-erased cells of the block. The possibility of loss of information because of a progressive degradation of the programming state of the not-erased cells, i.e. a partial loss of electric charge of the floating gate of the programmed cells because of repeated electric stresses suffered during erasing operations of one or more rows of the block, is effectively prevented.

The operation of zero confirmation or refresh in every not erased pages of a block at the end of an erasing operation of one or more pages of data, is carried out by reading every byte of the not erased pages and programming every cells containing a logic zero. Such refresh operation, limited to confirm every zero of the block, obviously requires a certain time which adds to the time taken by the erasing operation of one or more rows (pages) of the block giving the total time requisite of an erasing operation. The limit imposed to this total erasing time becomes the only constraint which determines the maximum size of each EEPROM block. In practice, considering that for a normal application of this type of memory device, the total time constraint of an erasing operation is in the order of several milliseconds, it is possible to realize the memory portion or matrix with EEPROM functionality in blocks with a size of several Kbyte, i.e. with a granularity far less economically penalizing, compared to a single page granularity, as would be the case with prior art approaches.

Figure 4:
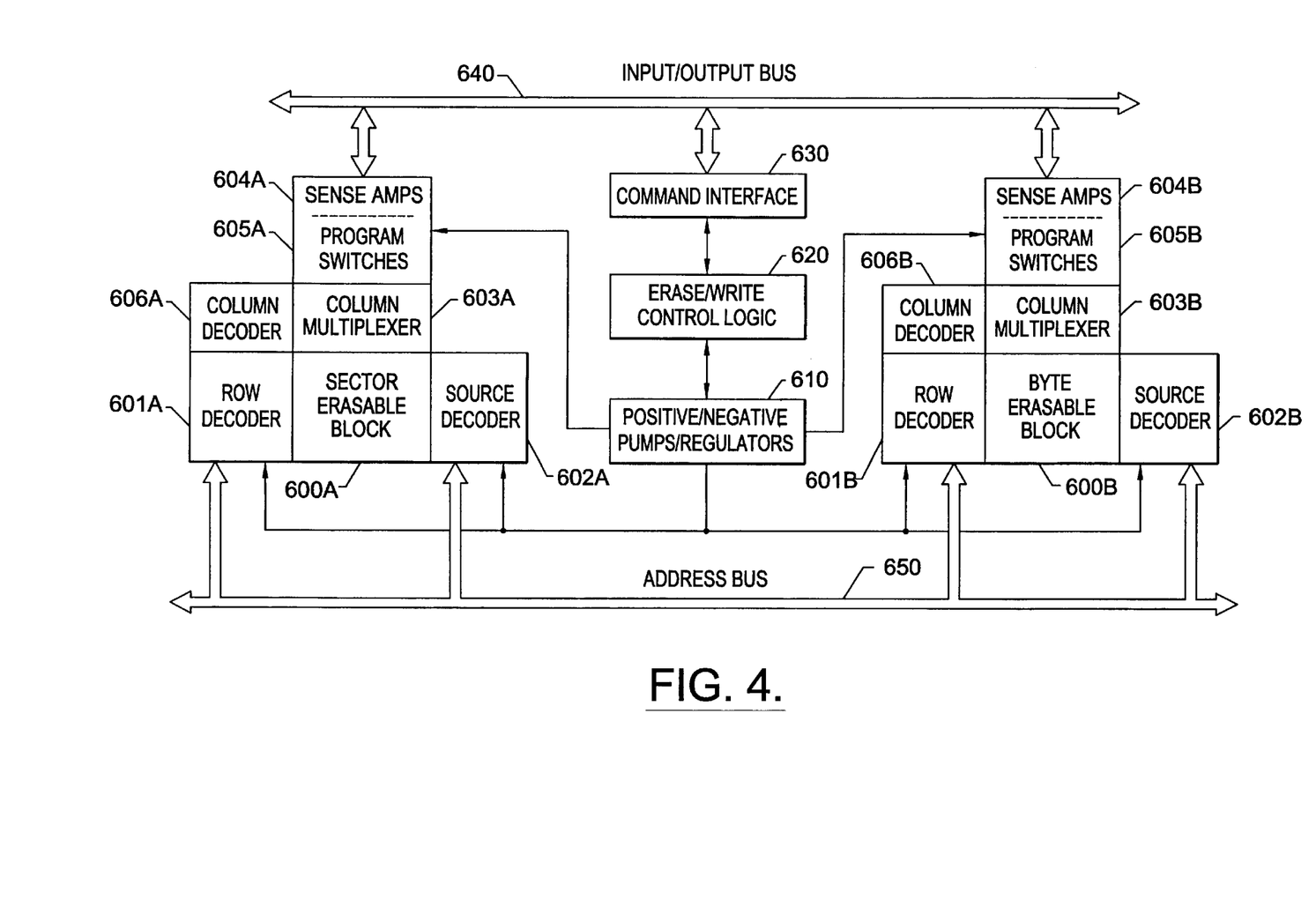
FIG. 4 is a sample block diagram of a device integrating an array of FLASH memory cells and an EEPROM array, according to the present invention.

FIG. 4 shows a block diagram of an example of integrated circuit of the invention containing both a FLASH-EPROM matrix 600A and an EEPROM matrix 600B. Each of these matrices has an array of row decoders 601A/601B, common source 602A/602B decoders, column multiplexers 603A/603B, sense amplifiers 604A/604B, programming switches 605A/605B and column decoders 606A/606B. Generally, these components may be of conventional kind and preferably have a hierarchic architecture, except for their connections to the sources of the various voltages, boosted or not, and of the appropriate sign, necessary to implement the writing and erasing schemes according to the method of the invention, as described above and indicated in the respective tables, for biasing the source and body (the isolated region of the block) contacts, besides the addressed bitlines and wordlines.

Each memory matrix is interfaced to an address bus 650 and to a data bus 640. The data bus 640 is interfaced to a logic command interface 630, which is interfaced to an erasing/writing control logic 620. The erasing/writing control logic 620 drives the circuitry 610 that generates the required voltages, which commonly includes charge pump circuits for producing negative and positive voltages, and associated voltage regulators. The voltages, boosted and/or of the opposite sign to that one of the supply voltage of the device, produced by the circuitry 610 are fed to the programming switches 605A/605B, to the row decoders 601A/601B, to the source decoders 602A/602B and, via suitable contacts, also to the isolated substrates of the different blocks of subdivision of the memory matrices.

Preferably, the page-wise (row-wise) erasing algorithm of the blocks with EEPROM functionality differs from the erasing algorithm used for FLASH-EPROM blocks in that the erasing voltages are not applied, as in the case of FLASH-EPROM blocks, for incrementally long intervals until the cells of the block verify the erase test. Such a typical erasing method determines erasing times that vary from one device to another depending on the device history and such a system is hardly compatible with the erasing specifications of a memory with EEPROM functionality. The blocks of the EEPROM matrix are preferably page-wise-erased, by applying a sequence of pulse of erasing voltages of a progressively growing level and by carrying out an erase check after each pulse. Such a method, avoids "over-erasings" and remarkably reduces the spread of erasing times due to the spread of the processes and to their history of erasing cycles.

The method and the architecture of the invention provide a memory array with an EEPROM functionality, erasable by page of data coincident with the information content of a row of cells of a determined block of subdivision of the memory array, completely via hardware. Nevertheless, when the application requires a byte-wise erasability, this can be achieved only partially via hardware, and a software elaboration is required including reading and copying the information of a whole page (e.g. the bytes contained in a single selected row of memory cells) in a RAM buffer, updatable with the modified data, and in reprogramming the data of the whole page read from the RAM buffer in the erased row of cells.

Even in an application of this kind, the method of the invention assures an enhanced reliability and speed by virtue of the fact that the RAM buffer has a size limited to accommodate the information content of a single page corresponding to a single row of memory cells of a certain block of the EEPROM array and the time to rewrite the data after updating them in the buffer register in the erased row of cells is relatively short.

That which is claimed is:

1. An integrated circuit to be connected to a first supply voltage and to a reference voltage, comprising:

a first matrix of floating gate memory cells organized in a first plurality of subdivision blocks, each subdivision block being organized in a plurality of words of a plurality of bits, all the memory cells belonging to one of the first plurality of subdivision blocks being formed in a first confined region of a semiconductor substrate confined by a first isolating buried region and by a first perimeter isolating region both of a conductivity opposite to a conductivity of the confined region of the semiconductor substrate;

a first plurality of wordlines and bitlines for individually selecting the plurality of words and the plurality of bits of each subdivision block of the first matrix;

a first hierarchical address decoder for accessing the plurality of wordlines and bitlines, to read, program and erase information in the memory cells of the first matrix;

a second matrix of floating gate memory cells organized in a second plurality of subdivision blocks, each block being organized in a plurality of words of a plurality of bits, all the memory cells belonging to one of the second plurality of subdivision blocks being formed in a second confined region of the semiconductor substrate confined by a second isolating buried region and by a second perimeter isolating region both of a conductivity opposite to a conductivity of said second confined region of the semiconductor substrate, information stored in the second matrix being organized in pages, each page being contained in a row of memory cells of one of said second subdivision blocks;

a second plurality of wordlines and bitlines for individually selecting the plurality of words and the plurality of bits of each subdivision block of the second matrix;

a second hierarchical address decoder for accessing the second plurality of wordlines and bitlines, to read, program and erase information in the memory cells of the second matrix, said second hierarchical address decoder including a row decoder for addressing the wordline of all the memory cells of a selected row of one of said second subdivision blocks, co-operating with a column decoder for selecting single memory cells of the rows;

at least one first charge pump circuit generating a first boosted voltage of a same polarity as the first supply voltage, and at least one second charge pump circuit generating a second boosted voltage of an opposite polarity as the first supply voltage, said second boosted voltage being applied during an erasing phase to a single wordline selected by said row decoder, to page-erase information by applying said first boosted voltage to a common source of all the memory cells of one of the second subdivision blocks and to the second confined region of the semiconductor substrate containing all the memory cells of the one of the second subdivision blocks; and a logic circuit for confirming a programmed state of each memory cell containing a logic zero of non-erased rows of the one of the second subdivision blocks after one or more rows or pages have been erased, by applying said first boosted voltage to one wordline at a time and said first supply voltage to one or more bitlines at a time for confirming a preexistent programmed state, while keeping the common source of all the memory cells of the second subdivision block and the second confined region of the semiconductor substrate at the reference voltage.

2. The integrated circuit according to claim 1, wherein a maximum size of each second subdivision block of said second matrix, is limited exclusively by a predetermined time allowed for erasing and rewriting one or more memory cell rows and confirming the programmed state of every programmed memory cell of the non-erased rows of the second subdivision block.

3. The integrated circuit according to claim 1, wherein said second hierarchical address decoder further comprises an SRAM register having a byte or word capacity corresponding to a capacity of a row of memory cells of a second subdivision block of said second matrix to provide a byte or word erasability and reprogrammability.

4. The integrated circuit according to claim 1, further comprising a third charge pump circuit for generating a third boosted voltage of same polarity as the first supply voltage and which is applied to one or more bitlines at a time of a selected row to confirm the programmed state of programmed memory cells of a second subdivision block of said second matrix.

5. The integrated circuit according to claim 1, further comprising a fourth charge pump circuit for generating a fourth boosted voltage of an opposite polarity as the first supply voltage and which is applied to the semiconductor substrate during a page-wise phase of programming or of confirmation of programming of a second subdivision block of memory cells.

6. The integrated circuit according to claim 1, further comprising a second supply voltage which is higher than said first supply voltage, and which is used for programming the memory cells of the first matrix.

7. The integrated circuit according to claim 1, wherein the reference voltage is ground.

8. An integrated circuit comprising:
   a semiconductor substrate having a plurality of first isolated regions and a plurality of second isolated regions;
   a FLASH-EPROM comprising
      a first plurality of subdivision blocks of floating gate memory cells, each subdivision block being organized in a plurality of words of a plurality of bits, all the memory cells of each of the first plurality of subdivision blocks being respectively formed in one of the plurality of first isolated regions of the semiconductor substrate,
      a first plurality of wordlines and bitlines for individually selecting the plurality of words and the plurality of bits of each of the first plurality of subdivision blocks, and
      a first address decoder for accessing the plurality of wordlines and bitlines, to read, program and erase information in the memory cells;
   an EEPROM comprising
      a second plurality of subdivision blocks of floating gate memory cells, each subdivision block being organized in a plurality of words of a plurality of bits, all the memory cells of each of the second plurality of subdivision blocks being respectively formed in one of the plurality of second isolated regions of the semiconductor substrate,
      a second plurality of wordlines and bitlines for individually selecting the plurality of words and the plurality of bits of each of the plurality of second subdivision blocks, and
      a second address decoder for accessing the second plurality of wordlines and bitlines, to read, program and erase information in the memory cells, said second address decoder including a row decoder for addressing the wordline of all the memory cells of a selected row of one of said second subdivision blocks, and a column decoder, co-operating with said row decoder, for selecting single memory cells of the rows; and
   at least a first charge pump circuit for generating a first boosted voltage of a same polarity as the first supply voltage, and at least a second charge pump circuit for generating a second boosted voltage of an opposite polarity as the first supply voltage for erasing a single wordline selected by said row decoder, and for row-erasing information while said first boosted voltage is applied to a common source of all the memory cells of one of the second subdivision blocks and to the second isolated region of the semiconductor substrate containing all the memory cells of the one of the second subdivision blocks.

9. The integrated circuit according to claim 8, further comprising a logic circuit for confirming a programmed state of each memory cell containing a logic zero of non-erased rows of the one of the second subdivision blocks after one or more rows has been erased, by applying said first boosted voltage to one wordline at a time and said first supply voltage to one or more bitlines at a time for confirming a preexistent programmed state, while keeping the common source of all the memory cells of the second subdivision block and the second confined region of the semiconductor substrate at the reference voltage.

10. The integrated circuit according to claim 8, wherein said plurality of first isolated regions are each confined by a first isolating buried region and by a first perimeter isolating region both of a conductivity opposite to a conductivity of the first isolated region of the semiconductor substrate; and wherein said plurality of second isolated regions are each confined by a second isolating buried region and by a second perimeter isolating region both of a conductivity opposite to a conductivity of said second isolated region of the semiconductor substrate.

11. The integrated circuit according to claim 8, wherein the first and second address decoders are hierarchical decoders.

12. The integrated circuit according to claim 8, wherein a maximum size of each second subdivision block of said EEPROM, is limited exclusively by a predetermined time allowed for erasing and rewriting one or more memory cell rows and confirming the programmed state of every programmed memory cell of the non-erased rows of the second subdivision block.

13. The integrated circuit according to claim 8, wherein said second address decoder further comprises a buffer having a byte or word capacity corresponding to a capacity of a row of memory cells of one second subdivision block of said EEPROM to provide a byte or word erasability and reprogrammability.

14. The integrated circuit according to claim 8, further comprising a third charge pump circuit for generating a third boosted voltage of a same polarity as the first supply voltage and which is applied to one or more bitlines at a time of a selected row to confirm the programmed state of programmed memory cells of a second subdivision block of said EEPROM.

15. The integrated circuit according to claim 8, wherein information stored in the EEPROM is organized in pages, each page being contained in a row of memory cells of one of said second subdivision blocks.

16. The integrated circuit according to claim 15, further comprising a fourth charge pump circuit for generating a fourth boosted voltage of an opposite polarity as the first supply voltage and which is applied to the semiconductor substrate during a page-wise phase of programming or of confirmation of programming of a second subdivision block of memory cells.

17. The integrated circuit according to claim 8, further comprising a second supply voltage which is higher than said first supply voltage, and which is used for programming the memory cells of the FLASH-EPROM.

18. The integrated circuit according to claim 8, wherein the reference voltage is ground.

19. A method of making an integrated circuit memory comprising:

providing a semiconductor substrate having a plurality of first isolated regions and a plurality of second isolated regions;

forming a FLASH-EPROM comprising
a first plurality of subdivision blocks of floating gate memory cells, by organizing each subdivision block in a plurality of words of a plurality of bits, and by respectively forming all the memory cells of each of the first plurality of subdivision blocks in one of the plurality of first isolated regions of the semiconductor substrate,
a first plurality of wordlines and bitlines for individually selecting the plurality of words and the plurality of bits of each of the first plurality of subdivision blocks of the FLASH-EPROM, and
a first address decoder for accessing the plurality of wordlines and bitlines, to read, program and erase information in the memory cells;

forming an EEPROM comprising
a second plurality of subdivision blocks of floating gate memory cells, by organizing each subdivision block in a plurality of words of a plurality of bits, and by respectively forming all the memory cells of each of the second plurality of subdivision blocks in one of the plurality of second isolated regions of the semiconductor substrate;
a second plurality of wordlines and bitlines for individually selecting the plurality of words and the plurality of bits of each of the plurality of second subdivision blocks, and
a second address decoder for accessing the second plurality of wordlines and bitlines, to read, program and erase information in the memory cells, said second address decoder including a row decoder for addressing the wordline of all the memory cells of a selected row of one of said second subdivision blocks, and a column decoder, co-operating with said row decoder, for selecting single memory cells of the rows; and providing at least a first charge pump circuit for generating a first boosted voltage of a same polarity as the first supply voltage, and at least a second charge pump circuit for generating a second boosted voltage of an opposite polarity as the first supply voltage for erasing a single wordline selected by said row decoder, and for row-erasing information while said first boosted voltage is applied to a common source of all the memory cells of one of the second subdivision blocks and to the second isolated region of the semiconductor substrate containing all the memory cells of the one of the second subdivision blocks.

20. The method according to claim 19, further comprising providing a logic circuit for confirming a programmed state of each memory cell containing a logic zero of non-erased rows of the one of the second subdivision blocks after one or more rows has been erased, by applying said first boosted voltage to one wordline at a time and said first supply voltage to one or more bitlines at a time for confirming a preexistent programmed state, while keeping the common source of all the memory cells of the second subdivision block and the second confined region of the semiconductor substrate at the reference voltage.

21. The method according to claim 19, wherein said plurality of first isolated regions are each confined by a first isolating buried region and by a first perimeter isolating region both of a conductivity opposite to a conductivity of the first isolated region of the semiconductor substrate; and wherein said plurality of second isolated regions are each confined by a second isolating buried region and by a second perimeter isolating region both of a conductivity opposite to a conductivity of said second isolated region of the semiconductor substrate.

22. The method according to claim 19, wherein the first and second address decoders are hierarchical decoders.

23. The method according to claim 19, wherein a maximum size of each second subdivision block of said EEPROM, is limited exclusively by a predetermined time allowed for erasing and rewriting one or more memory cell rows and confirming the programmed state of every programmed memory cell of the non-erased rows of the second subdivision block.

24. The method according to claim 19, wherein said second address decoder further comprises a buffer having a byte or word capacity corresponding to a capacity of a row of memory cells of one second subdivision block of said EEPROM to provide a byte or word erasability and reprogrammability.

25. The method according to claim 19, further comprising providing a third charge pump circuit for generating a third boosted voltage of a same polarity as the first supply voltage and which is applied to one or more bitlines at a time of a selected row to confirm the programmed state of programmed memory cells of a second subdivision block of said EEPROM.

26. The method according to claim 19, wherein information stored in the EEPROM is organized in pages, each page being contained in a row of memory cells of one of said second subdivision blocks.

27. The method according to claim 26, further comprising providing a fourth charge pump circuit for generating a fourth boosted voltage of an opposite polarity as the first supply voltage and which is applied to the semiconductor substrate during a page-wise phase of programming or of confirmation of programming of a second subdivision block of memory cells.

28. The method according to claim 19, further comprising a second supply voltage which is higher than said first supply voltage, and which is used for programming the memory cells of the FLASH-EPROM.

29. The method according to claim 19, wherein the reference voltage is ground.

* * * * *